United States Patent
Schiefelbein et al.

(10) Patent No.: US 10,938,165 B2
(45) Date of Patent: Mar. 2, 2021

(54) ELECTRIC PLUG-IN CONNECTOR HAVING A PLUGGING CYCLE COUNTER

(71) Applicant: Siemens Aktiengesellschaft, Munich (DE)

(72) Inventors: Frank-Peter Schiefelbein, Potsdam (DE); Christian Wegener, Berlin (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 16/478,610

(22) PCT Filed: Jan. 17, 2018

(86) PCT No.: PCT/EP2018/051046
§ 371 (c)(1),
(2) Date: Jul. 17, 2019

(87) PCT Pub. No.: WO2018/134217
PCT Pub. Date: Jul. 26, 2018

(65) Prior Publication Data
US 2020/0052446 A1 Feb. 13, 2020

(30) Foreign Application Priority Data
Jan. 20, 2017 (DE) .................... 10 2017 200 931.4

(51) Int. Cl.
*H01R 13/66* (2006.01)
*H01L 41/113* (2006.01)
*H01R 13/11* (2006.01)

(52) U.S. Cl.
CPC ...... *H01R 13/6683* (2013.01); *H01L 41/1132* (2013.01); *H01R 13/11* (2013.01)

(58) Field of Classification Search
CPC .. H01R 13/6683; H01R 13/11; H01L 41/1132
See application file for complete search history.

(56) References Cited

U.S. PATENT DOCUMENTS 3,388,590 A 6/1968 Dryden ........................ 73/771
8,564,279 B2 * 10/2013 Johnson ................ G01R 1/22
324/127

(Continued)

FOREIGN PATENT DOCUMENTS

DE 23 07 951 B1 10/1973 ............ H01R 13/62
DE 10 2010 045 329 A 3/2012

(Continued)

OTHER PUBLICATIONS

Search Report for DE Patent Application No. 10 2017 200 931.4, 10 pages, dated Dec. 7, 2017.

(Continued)

*Primary Examiner* — Briggitte R. Hammond
(74) *Attorney, Agent, or Firm* — Slayden Grubert Beard PLLC

(57) ABSTRACT

An electric plug-in connector comprising: an electric contact structure accommodated in an enclosure; and a plugging cycle counter including a piezoelectric sensor mechanically connected to the contact structure and/or to the enclosure. The piezoelectric sensor senses joining of the electric contact structure to a corresponding electric contact structure.

11 Claims, 3 Drawing Sheets

(56) References Cited

U.S. PATENT DOCUMENTS

| | | | |
|---|---|---|---|
| 8,727,802 B2* | 5/2014 | Anastas | H01R 13/641 |
| | | | 439/489 |
| 10,211,576 B2* | 2/2019 | Emrani | H01H 27/00 |
| 2013/0170604 A1* | 7/2013 | Falk | G07C 11/00 |
| | | | 377/15 |
| 2016/0097801 A1 | 4/2016 | Polland | 324/538 |
| 2016/0294116 A1* | 10/2016 | Kloppenburg | H01R 13/627 |
| 2017/0229821 A1 | 8/2017 | Emrani | H01R 13/66 |

FOREIGN PATENT DOCUMENTS

| | | | |
|---|---|---|---|
| DE | 20 2011 052 324 U1 | 3/2013 | ......... H01R 13/641 |
| DE | 10 2017 102 096 A1 | 8/2017 | |
| JP | H058880 U * | 2/1993 | |
| JP | 2016 100114 | 5/2016 | ............ H01R 13/66 |
| WO | 2015/070946 A1 | 5/2015 | ......... H01R 13/629 |

OTHER PUBLICATIONS

Search Report for PCT Patent Application No. PCT/EP2018/051046, 12 pages, dated Apr. 6, 2018.

* cited by examiner

ELECTRIC PLUG-IN CONNECTOR HAVING A PLUGGING CYCLE COUNTER

CROSS-REFERENCE TO RELATED APPLICATIONS

This application is a U.S. National Stage Application of International Application No. PCT/EP2018/051046 filed Jan. 17, 2018, which designates the U.S., and claims priority to DE Application No. 10 2017 200 931.4 filed Jan. 20, 2017, the contents of which are hereby incorporated by reference in their entirety.

TECHNICAL FIELD

The present disclosure relates to electric plug-in connectors. Various embodiments may include an electric contact structure and a plugging cycle counter.

BACKGROUND

An example plug-in connector is described in DE2010/045329 A1. Plugging cycle counters may be used, for example, in the case of plug-in connections used for charging electric motor vehicles. The plugging cycle counter is intended to prevent the plug-in connector from being used beyond a predefined number of plugging cycles, in order to reduce the incident rate of malfunctions. For example, the plugging cycle counter may communicate with the charging station for the electric motor vehicle and prevent activation of the charging station if the admissible number of plugging cycles of the plug-in connector is exceeded.

WO 2015/070946 A1 describes a plug-in connector having a mechanical counting mechanism for counting the plugging cycles. The plug-in connector has a pin, which is pushed into the plug-in connector as the plug-in connection is being made, and thereby actuates the mechanical counting mechanism.

Electric plug-in connectors are widely used in engineering. In this disclosure, a "plug-in connector" means a component that allows electric conductors to be connected, the plug-in connector performing the task of establishing a connection to and/or disconnecting from a matching mating component (the connecting and disconnecting constitutes one plugging cycle. The matching mating component is thus also a plug-in connector.

Usually, plug-in connections thus consist of a pin contact and a socket contact into which the pin contact can be inserted. In addition, there are also plug-in contacts in which the contacts are constructed such that they engage in each other, and thus the same connection geometry of the plug-in connector can be used on both sides of the plug-in connection. Contact pins may be flat, square, and/or round. The socket contact may consist, for example, of a tuning-fork contact, which may be stamped from a flat metal plate. The contact region for the contact pin is flexible, such that an acting pressure is produced for the purpose of making the contact following insertion of the pin contact. To increase this acting pressure, so-called double or triple spring contacts may also be used, in which case the stamped metal plate is folded for the purpose of generating the spring effect. Precision contacts may also include other spring mechanisms and are equipped with a plurality of contact laminations.

Plug-in connectors produce electromechanical, separable connections of the contact partners. Circuit carriers, electronic or electromechanical assemblies, and/or printed circuit boards may be used as contact partners. Connections may be made to external devices such as sensors, keyboards, displays, cables or other assemblies. Circuit carriers can also be directly connected to each other.

A fundamental reason for using a plug-in connection is its separability. This may be desirable for a variety of reasons, e.g. because of production strategy considerations, to enable assemblies or sub-systems to be produced independently of each other and to be brought together only at the time of final assembly. Another requirement may be the possibility of exchanging assemblies. Moreover, repeated connecting of devices to each other, or of devices to cables, is a typical application. In the design of the plug-in connection, the application determines the number of plugging cycles for which the plug-in connection is to withstand. For example, if printed circuit boards in a switchgear cabinet are connected to plug-in connectors, plugging cycles arise only in the case of replacement of circuit carriers, which is required comparatively seldom. The plug-in connectors may be designed for 25 plugging cycles. If the plug-in connection is intended for a connection cable (for example, a charging cable), this results in comparatively high necessary plugging cycles, of over 100, or even over 1000, plugging cycles.

SUMMARY

These requirements may be met with electric plug-in connectors having plugging cycle counters, resulting in an additional constructional requirement with associated costs. The teachings of the present disclosure include electric plug-in connectors having a plugging cycle counter, in which the plugging cycle counter has a high functional reliability and with which the plugging cycle counter can be produced inexpensively.

For example, some embodiments include an electric plug-in connector having an electric contact structure (11, 12) accommodated in an enclosure (13a, 13b) and having a plugging cycle counter, characterized in that for the purpose of detecting plugging operations, the plugging cycle counter is equipped with a piezoelectric sensor (15a, 15b), which is mechanically connected to the contact structure (11, 12) and/or to the enclosure.

In some embodiments, the electric contact structure is embodied as a pin contact (12) or as a socket contact (11).

In some embodiments, the piezoelectric sensor (15d, 15e, 15f) is mounted on a receiving surface (32) of the enclosure (13a, 13b) for a corresponding plug-in connector, or is embedded, beneath this receiving surface, in the material of the enclosure.

In some embodiments, the piezoelectric sensor (15a) is mechanically fixed between two sub-regions of the contact structure (12), wherein these sub-regions are movable relative to each other.

In some embodiments, the piezoelectric sensor (15b) is mechanically fixed between the contact structure (11) and the enclosure (13a, 13b), wherein the contact structure (11) is movable relative to the enclosure.

In some embodiments, the piezoelectric sensor consists of a plurality of disks (27), which are mechanically connected in series, wherein the disks (27) are delimited on both sides by electrode plates (25), which are alternately electrically connected in parallel.

In some embodiments, there is an evaluation unit (17a, 17b), having a memory module (29) for the number of plugging cycles effected, integrated into the plug-in connector.

In some embodiments, the evaluation unit (17a, 17b) has an output module for information relating to the number of plugging cycles.

In some embodiments, the energy supply of the evaluation unit (17a, 17b) is realized by the piezoelectric sensor (15a, 15b).

In some embodiments, the energy supply of the evaluation unit (17a, 17b) is additionally realized by the output module (30) embodied as a transponder having an antenna.

As another example, some embodiments include a method for operating a plug-in connector as described above, characterized in that a plug-in connection is opened or closed by means of the plug-in connector, the forces produced during the operation of establishing or opening generate, at the piezoelectric sensor (15a, 15b), an electric charge that causes a current flow in a measuring electric circuit (16a, 16b), and the current flow is counted.

In some embodiments, the electrical energy generated by the piezoelectric sensor (15a, 15b) is used to operate an evaluation unit (17a, 17b) having a memory module (29) for counting the plugging cycles.

BRIEF DESCRIPTION OF THE DRAWINGS

Further details of the teachings herein are described in the following on the basis of the drawing. Drawing elements that are the same or that correspond are in each case denoted by the same references, and explanation thereof is repeated only insofar as there are differences between the individual figures. There are shown.

DETAILED DESCRIPTION

Figure 1:
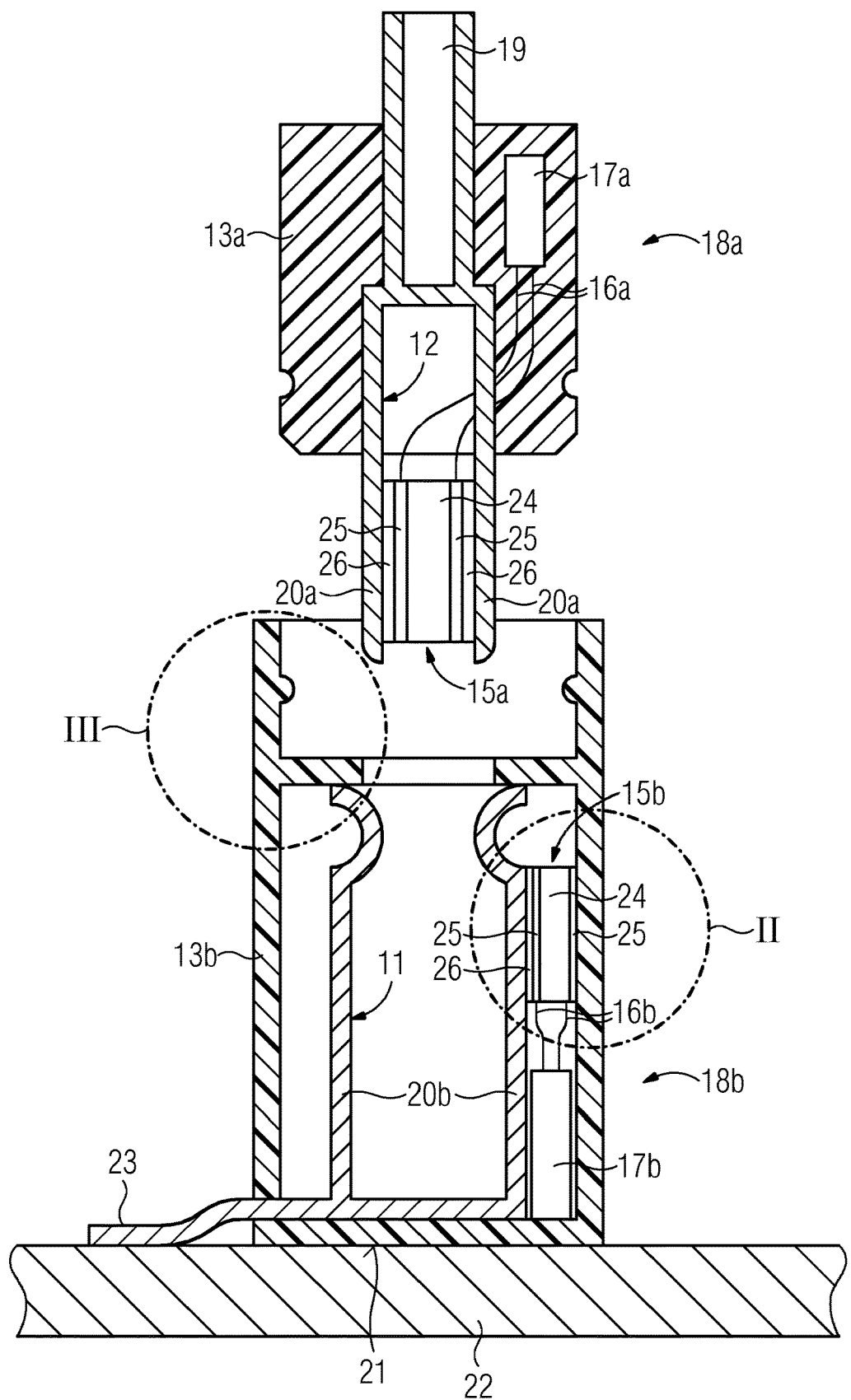
FIG. 1 an exemplary embodiment for two complementary plug-in connectors incorporating the teachings herein, which can be plugged together to form a plug-in connection, FIG. 2 the use of a piezoelectric sensor, consisting of a plurality of disks, which could be incorporated at position II according to FIG. 2 of the plug-in connector, and FIG. 3 exemplary embodiments for the alternative accommodation of piezoelectric sensors incorporating the teachings herein in a region III according to FIG. 1, in cross section.

In some embodiments, an electric plug-in connector includes, for the purpose of detecting plugging operations, a plugging cycle counter equipped with a piezoelectric sensor, which is mechanically connected to the contact structure. In the case of a piezoelectric sensor, use is made of the effect that, for the purpose of forming the electrical contact in the plug-in connector, it is always necessary to ensure a certain contact force with which the contact surfaces must be pressed onto each other for the purpose of transmitting an electric current. Owing to the mechanical connection of the sensor to the contact structure, which provides a contact surface for the purpose of making the electrical contact, it is possible for the plugging cycle to be sensed by means of the piezoelectric sensor, in that a contact force is built up in the plug-in connector. This contact force is then transmitted to the piezoelectric sensor, the latter being elastically deformed, as is the contact structure.

Thus, both upon closing and opening of the electrical connection, a plugging operation generates an electrical pulse in the piezoelectric sensor. To enable this electrical pulse to be detected, the piezoelectric sensor must be electrically insulated from the contact element. There is therefore only a mechanical connection for transmitting the contact force.

In some embodiments, the plug-in connector is accommodated in an enclosure of the plug-in connector (plug-in connector enclosure). The latter performs the function of electrically insulating the plug-in contacts from each other and with respect to the surroundings. Mechanical functions of the enclosure consist in the positioning of the contact structure and in receiving the other plug-in connector for the purpose of establishing the electrical contact. Holding of the other plug-in connector may be effected by a non-positive or a positive engagement. Moreover, the piezoelectric sensor may be supported in the enclosure, so that the contact force can act upon the piezoelectric sensor.

In some embodiments, the structural design of the electric plug-in connector may be easily assembled, so the piezoelectric sensor can be inserted in the enclosure. It is also possible, however, for the piezoelectric sensor to be integrated into the contact structure in such a manner that the deformation of the latter also deforms the piezoelectric sensor. This can be achieved in that the piezoelectric sensor is mechanically fixed between two sub-regions of the contact structure, wherein these sub-regions are movable relative to each other during plugging operations.

In some embodiments, the piezoelectric sensor consists of a plurality of disks which are mechanically connected in series, wherein the disks are delimited on both sides by electrode plates which are alternately electrically connected in parallel. This makes it possible to produce a piezoelectric sensor in which the electrical current pulse produced upon occurrence of the contact force is a multiple of the pulse that would be produced if the piezoelectric sensor were constructed only from one disk. As a result, the sensor signal is more easily sensed during the plugging-in or unplugging of the plug-in connector, since a less sensitive design of an evaluation unit for sensing the plugging operation is needed. In some embodiments, the evaluation unit may be integrated into the plug-in connector and have a memory module for the number of plugging cycles effected.

In some embodiments, the evaluation unit also has an output module, for information relating to the number of plugging cycles. The output module may either output the number of plugging cycles already effected (e.g. a display), or merely indicate the exceeding of the maximum number of plugging cycles (e.g. an LED). It is thereby possible for the relevant information concerning the plugging cycles to be indicated directly on the connector enclosure.

In some embodiments, the memory module may also be read out, in order to obtain the plugging cycle number. For this purpose, an RFID tag may be used as an output module (RFID stands for Radio Frequency Identification). The RFID tag consists of a transponder and an antenna, the transponder being supplied with electrical energy via the antenna. In some embodiments, during the read-out, the rest of the evaluation unit may be supplied with energy by the output module (i.e. the RFID tag) embodied as a transponder having an antenna.

In some embodiments, the energy supply of the evaluation unit during the registering of the plugging cycles may be realized by the piezoelectric sensor. In this case, not only is the electric charge that is generated by the piezoelectric effect used for counting the plugging cycles, but the current flow effected by the charge is used as an energy supply for the evaluation unit. In some embodiments, the evaluation unit can thus operate as an autonomous system, without being equipped with an energy storage device, for example in the form of a battery. This also assumes that the memory module contains a non-volatile memory that, for the purpose of storing in memory, is non-dependent on an energy supply.

In some embodiments, the piezoelectric sensor is mounted on a receiving surface of the enclosure for a corresponding plug-in connector, or is embedded, beneath the receiving surface, in the material of the enclosure. In this case, the plugging cycle is detected in that a force is exerted upon the receiving surface by the corresponding plug-in connector. This may be a pressure force that, because of the holding forces or the resultant friction during plugging, acts upon the receiving surface when the corresponding plug-in connector comes into contact with this receiving surface. In some embodiments, a plugging force necessary for closing the plug-in connection triggers in the piezoelectric sensor in dependence on which receiving surface is used to accommodate the sensor.

In some embodiments, the piezoelectric sensor may be mounted on the receiving surface, the piezoelectric sensor itself thus providing a part of the receiving surface. The piezoelectric sensor then comes into direct contact with the corresponding plug-in connector. In some embodiments, the piezoelectric sensor may be arranged outside of the receiving surface, in which case it is then embedded in the material of the enclosure. In this case, the piezoelectric sensor does not come into contact with the corresponding plug-in connector but, as a result of an elastic deformation of the material of the enclosure surrounding it, undergoes an increase in pressure that triggers the sensor signal.

In some embodiments, the piezoelectric sensor is mechanically fixed between two sub-regions of the contact structure, wherein these sub-regions are movable relative to each other. For example, the contact structure may have the shape of a fork, the piezoelectric sensor accommodated in the interspace formed by the fork (the fork in this case forms a pin contact). Upon the closing of the plug-in connection, the fork is compressed, as a result of which a sensor signal is generated in the piezoelectric sensor. This is a space-saving embodiment, which may be used in plug-in connectors acting as a pin contact. In this case, the outer side of the fork is used as a contact surface for the associated socket contact, whereas the inner side of the fork, as already explained, serves to receive the piezoelectric sensor.

In some embodiments, the piezoelectric sensor is mechanically fixed between the contact structure and the enclosure, wherein the contact structure is movable relative to the enclosure. In other words, the contact structure is elastically deformed upon closing of the contact, while the enclosure is realized with a greater mechanical stiffness. Therefore, upon closing of a plug-in connection, the contact force is applied to the piezoelectric sensor via the contact structure, as a result of which a sensor signal is generated. This structure may be suitable for socket contacts because, upon closing of the plug-in connection, the sockets deform toward the enclosure surrounding them.

Some embodiments include a method wherein a plug-in connection is closed or opened by means of the plug-in connector, and the forces produced during the operation of establishing or opening (as already explained, the forces are contact forces, pressure forces or plugging forces) generate, at the piezoelectric sensor, an electric charge that causes a current flow in a measuring electric circuit. This current flow is counted. The advantages already explained above may also be achieved by the method.

A current flow is generated both upon opening and upon closing of the plug-in connector. This is due to the fact that an electric charge is always produced at the piezoelectric sensor when the pressure applied to the piezoelectric crystal changes. This requires the evaluation unit to interpret each two measured current pulses as one plugging cycle.

In some embodiments, the electrical energy generated by the piezoelectric sensor is used to operate an evaluation unit having a memory module for the number of plugging cycles effected. The evaluation unit is in each case woken by opening or closing of the plug-in connection and the resulting current pulse, the electrical energy being sufficient to store the detected event in the memory module.

Represented in FIG. 1 are two plug-in connectors 18a, 18b, having contact structures 11, 12, one being embodied as a socket contact 11 and the other as a pin contact 12. They are realized so as to be complementary and can therefore be closed to form a plug-in connection. Both contact structures have an enclosure 13a, 13b, in which a contact structure is accommodated. Additionally provided in each case is a piezoelectric sensor 15a, 15b, which is connected to a respective evaluation unit 17a, 17b via a measuring electric circuit 16a, 16b.

The plug-in connector 18a having the pin contact 12 is produced in that the pin contact 12 is encapsulated in the enclosure 13a. The pin contact 12 has a receiving socket 19 for a cable end, not represented, and attached to the opposite end of the pin contact 12 are two tongues 20a, which are embodied as sub-regions that are movable relative to each other. The relative movement of these sub-regions is possible because of the elasticity of the metallic material of the pin contact. The piezoelectric sensor 15a is held between the tongues 20a.

The plug-in connector 18b is embodied as a socket contact 11 and has a mounting surface 21 for mounting on a circuit carrier 22. The socket contact 11 has a contact plate 23 which extends out of the enclosure 13b and lies on the circuit carrier 22. Electrical contacting of the socket contact 11 on the circuit carrier 22 is thereby possible, for example by means of a soldered connection, not represented in greater detail. In addition, the socket contact also has two tongues 20b, which are bent apart by the pin contact 12 upon closing of the plug-in connection.

In this case, an electrical signal, which can be fed into the evaluation unit 17b via the measuring electric circuit 16b, is generated in the piezoelectric sensor 15b, which is mounted between one of the tongues 20b and the enclosure 13b. The piezoelectric sensors each consist of a piezoelectric crystal 24, attached to the upper side and underside of which are electrode plates 25. The latter are connected to the electric circuit 16a, 16b. In addition, an electrical insulation layer 26 is in each case arranged with respect to the metallic contact structures 11, 12, so that a charge on the piezoelectric crystal cannot discharge into the contact structure 11, 12. The enclosure 13b is made from plastic, for which reason insulation of the piezoelectric sensor 15b with respect to the enclosure 13b is not necessary. The behavior is different in the case of the piezoelectric sensor 15a, which on both sides is supported on the tongues 20a and therefore has insulation layers 26 on both sides.

Figure 2:
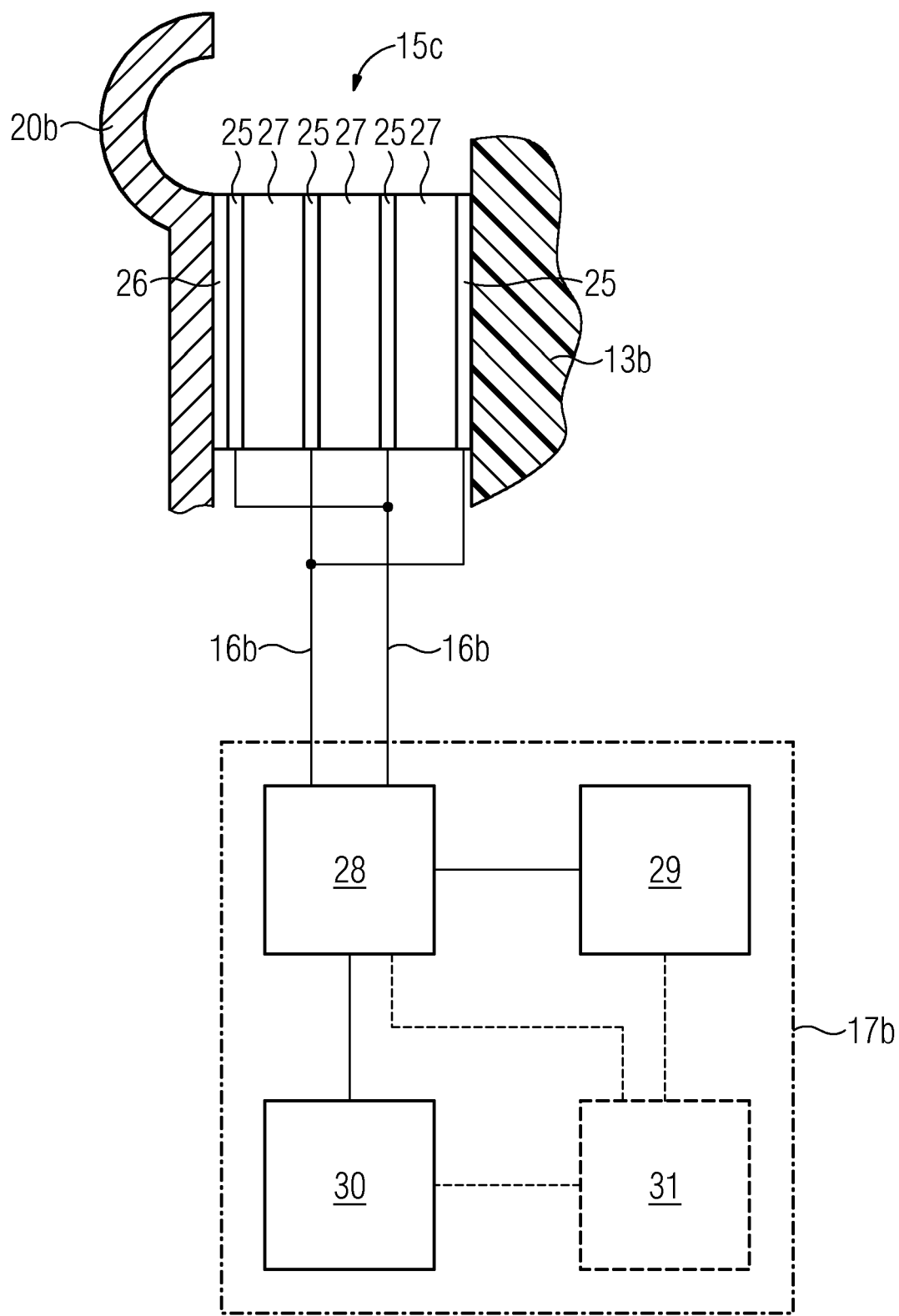

The piezoelectric sensor 15c according to FIG. 2 has a multilayer structure. It comprises a plurality of disks 27 of a piezoelectric material, for example a piezoelectric ceramic, such as a lead zirconate titanate ceramic or a monocrystalline material, such as quartz, tourmaline, or gallium phosphate. These disks 27 are arranged between electrode plates, which alternately form the plus pole and the minus pole for the electric circuit 16a, 16b. The disks are thus mechanically connected in series, but electrically in parallel, as a result of which the charge that can be generated is increased, in order to obtain a more readily detectable signal and, at the same time, to increase the energy supply of the evaluation unit 17b.

The evaluation unit 17b is represented schematically as a block diagram. It has a processor 28, which controls the evaluation unit 17b. On the one hand, the evaluation unit 17b is activated via the processor 28 as soon as a sensor signal of the piezoelectric sensor 15c flows across the electric circuit 16b, as a result of which the evaluation unit 17b is activated. This event is counted in the processor and is stored as a number in a memory module 29.

Some embodiments include an output module 30, which may be characterized by various functions. For example, the output module may consist of a red and a green light-emitting diode, with the generated current being used, while the plug-in connection is being separated or closed, to output a green flashing signal when within the service life and, if the service life is exceeded, to output a red flashing signal. Instead, it is also possible to use an LCD display that displays the number of plugging cycles. It is to be noted in this case that a plugging cycle consists of two events, namely, the opening and closing, such that the counted events must be divided by two in order to ascertain the number of plugging cycles.

In some embodiments, the output module comprises an RFID tag. This offers the possibility of being able to read out the number of plugging cycles by means of a read device at any time, the energy supply being effected from the outside, via an antenna. The functionality of the transponder may form a structural unit with the processor 28, or be integrated in the output module 30. In any case, the energy fed into the evaluation unit 17b via the antenna must also be sufficient for the processor 28 to retrieve the cycle-number information from the memory module 29.

Optionally, and therefore represented by a broken line, there may additionally also be an energy module 31 integrated into the evaluation unit 17b. This may be an electrical energy storage device, or also a combination of an energy storage device and an energy generator. In the latter case, the energy storage device must be chargeable, to enable the energy of the energy generator to be buffered. The energy generator may be, for example, a solar cell.

Figure 3:
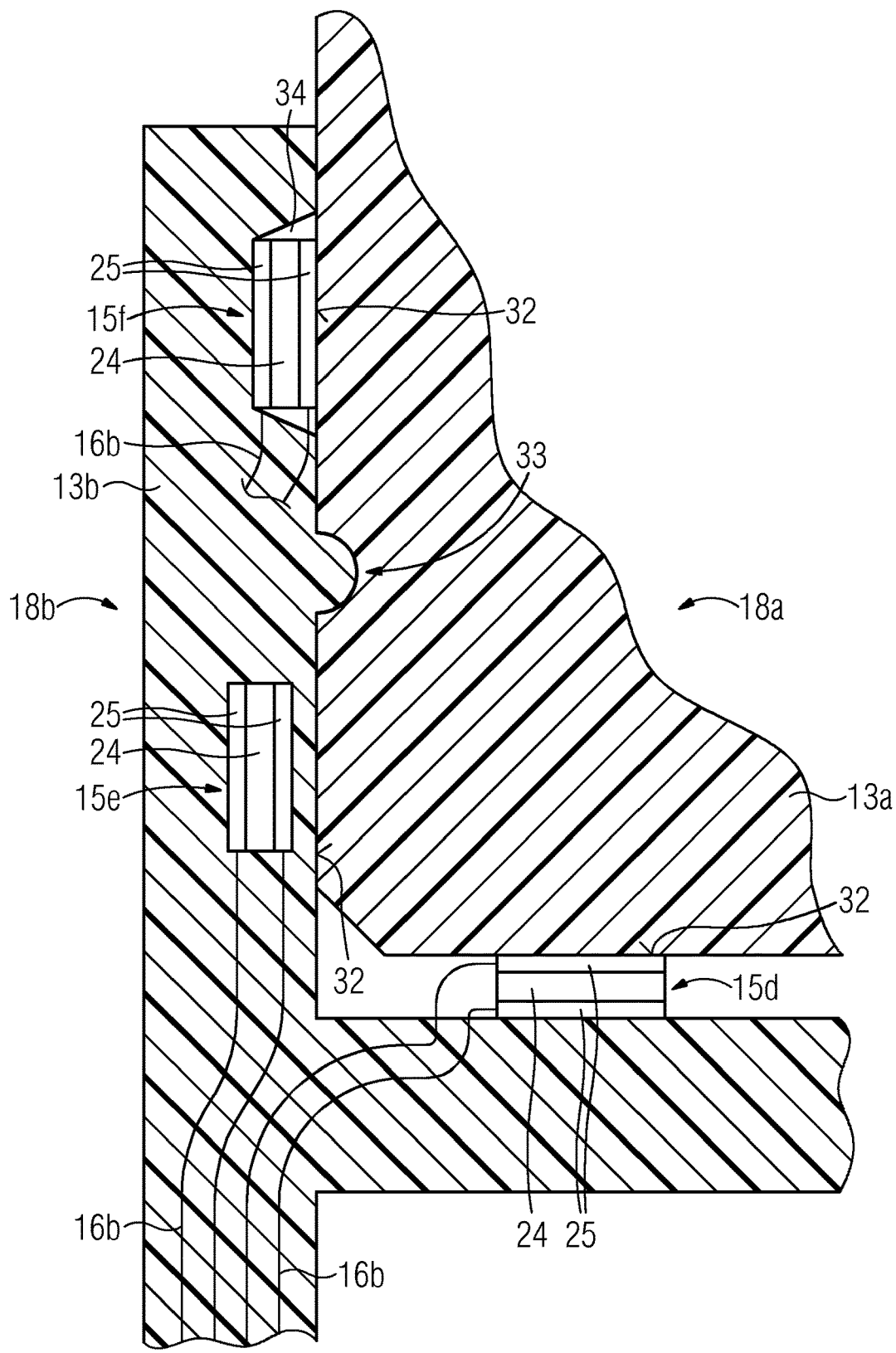

FIG. 3 shows further possibilities for mounting piezoelectric sensors 15d, 15e, 15f in the enclosure 18b, by which differing effects of the plugging operation can be detected. The piezoelectric sensor 15d is mounted on the wall of the enclosure 13b, and thus forms the part of a receiving surface 32. The receiving surface is the part of the surface in the plug-in connector 18b that contacts directly with the plug-in connector 18a in the closed state. Upon closing of the plug-in connection 18a, 18b, a plugging force is applied, which contributes to the latching-in of a latching connection 33. The plugging force is transmitted, via the receiving surface 32, to the piezoelectric sensor 15d, and can thus be counted.

A further part of the receiving surface 32 is realized between the side walls of the two enclosures 13a, 13b. Owing to the fit between the components, a force, which can be detected by the piezoelectric sensor 15e, is exerted upon the enclosure 13b. This sensor is fully encapsulated in the material of the enclosure 13b, this material being elastic, and the pressure exerted by the enclosure 13a being transmitted to the encapsulated piezoelectric sensor 15e.

The piezoelectric sensor 15f is mounted in a depression of the enclosure 13b in such a manner that it forms a part of the receiving surface 32, and therefore comes into contact with the enclosure 13a during plugging. During the plugging operation, therefore, a frictional force is produced, which is transmitted to the piezoelectric sensor and triggers an electrical signal of the piezoelectric sensor. Unlike the piezoelectric sensors 15a, 15b, 15c, 15d already described, which use the longitudinal effect to generate the sensor signal, in the case of the sensor 15f the shearing effect is used. To utilize the shearing effect, the sensor may also be of a multilayer structure, as described in FIG. 2.

FIGS. 1 to 3 give mounting examples for the sensors 15a to 15f. To enable plugging cycles to be sensed, there is not necessarily a need for a plurality of sensors, even if they increase the dependability of the sensing of plugging cycles. To enable plugging cycles to be counted for a plug-in connector, at least one piezoelectric sensor is required in the latter. If the plug-in connection is to be effected with plug-in connectors that are fixedly assigned to each other, it is even sufficient to count the plugging cycles in only one of the two plug-in connectors.

What is claimed is:

1. An electric plug-in connector comprising:
   an electric contact structure accommodated in an enclosure; and
   a piezoelectric sensor mechanically connected to the contact structure and/or to the enclosure;
   wherein the piezoelectric sensor senses joining of the electric contact structure to a corresponding electric contact structure;
   a plug-in connection is opened or closed by means of the plug-in connector;
   the forces produced during the operation of opening or closing generate an electric charge at the piezoelectric sensor;
   the electric charge causes a current flow in a measuring electric circuit; and
   a memory module stores a number representing a counter updated each time a current flows in the measuring circuit.

2. The plug-in connector as claimed in claim 1, wherein the electric contact structure comprises a pin contact or a socket contact.

3. The plug-in connector as claimed in claim 1, wherein the piezoelectric sensor is mounted on a receiving surface of the enclosure or is embedded beneath the receiving surface in the material of the enclosure.

4. The plug-in connector as claimed in claim 1, wherein the piezoelectric sensor is mechanically fixed between two sub-regions of the contact structure and the two sub-regions are movable relative to each other.

5. The plug-in connector as claimed in claim 1, wherein the piezoelectric sensor is mechanically fixed between the contact structure and the enclosure and the contact structure is movable relative to the enclosure.

6. An electric plug-in connector comprising:
   an electric contact structure accommodated in an enclosure; and
   a plugging cycle counter including a piezoelectric sensor mechanically connected to the contact structure and/or to the enclosure;
   wherein the piezoelectric sensor senses joining of the electric contact structure to a corresponding electric contact structure;
   wherein the piezoelectric sensor comprises a plurality of disks mechanically connected in series, wherein the disks are delimited on both sides by electrode plates alternately electrically connected in parallel.

7. The plug-in connector as claimed in claim 6, further comprising an evaluation unit with a memory module storing a counter for a number of plugging cycles completed.

8. The plug-in connector as claimed in claim 7, wherein the evaluation unit comprises an output for information relating to the number of plugging cycles completed.

9. The plug-in connector as claimed in claim 7, further comprising an energy supply for the evaluation unit, wherein the energy supply comprises the piezoelectric sensor.

10. The plug-in connector as claimed in claim 9, wherein the energy supply of the evaluation unit comprises a transponder having an antenna serving the output.

11. The plug-in connector as claimed in claim 1, wherein electrical energy generated by the piezoelectric sensor powers an evaluation unit with a memory module for counting the plugging cycles.

* * * * *